United States Patent
Hapke et al.

(10) Patent No.: US 8,990,760 B2
(45) Date of Patent: Mar. 24, 2015

(54) CELL-AWARE FAULT MODEL GENERATION FOR DELAY FAULTS

(75) Inventors: Friedrich Hapke, Winsen (DE); Wilfried Redemund, Trittau (DE); Juergen Schloeffel, Sproetze (DE); Andreas Glowatz, Heidenau (DE)

(73) Assignee: Mentor Graphics Corporation, Wilsonville, OR (US)

( * ) Notice: Subject to any disclaimer, the term of this patent is extended or adjusted under 35 U.S.C. 154(b) by 645 days.

(21) Appl. No.: 13/219,564

(22) Filed: Aug. 26, 2011

(65) Prior Publication Data

US 2013/0054161 A1 Feb. 28, 2013

(51) Int. Cl.
*G06F 17/50* (2006.01)
*G01R 31/3183* (2006.01)

(52) U.S. Cl.
CPC ...... *G01R 31/31835* (2013.01); *G06F 17/5036* (2013.01)
USPC ............................ 716/136; 716/106; 716/112

(58) Field of Classification Search
USPC ......................................... 716/106, 112, 136
See application file for complete search history.

(56) References Cited

U.S. PATENT DOCUMENTS

| | | | | |
|---|---|---|---|---|
| 5,422,891 | A * | 6/1995 | Bushnell et al. | 714/732 |
| 5,692,160 | A * | 11/1997 | Sarin | 703/23 |
| 6,385,750 | B1 * | 5/2002 | Kapur et al. | 714/738 |
| 6,832,182 | B1 * | 12/2004 | Wilson, Jr. | 703/13 |
| 7,082,559 | B2 * | 7/2006 | Nozuyama | 714/726 |
| 7,137,083 | B2 * | 11/2006 | Hildebrant | 716/112 |
| 7,747,972 | B2 * | 6/2010 | Mirbeth et al. | 716/113 |
| 7,802,214 | B2 * | 9/2010 | Bargfrede et al. | 716/108 |
| 8,099,269 | B2 * | 1/2012 | Topaloglu et al. | 703/14 |
| 8,122,423 | B2 * | 2/2012 | Zjajo et al. | 716/136 |
| 8,362,622 | B2 * | 1/2013 | Sproch et al. | 257/774 |
| 2008/0141199 | A1 * | 6/2008 | Bargfrede et al. | 716/6 |
| 2010/0109676 | A1 * | 5/2010 | Zjajo et al. | 324/537 |
| 2010/0229061 | A1 | 9/2010 | Hapke | |
| 2010/0293426 | A1 * | 11/2010 | Dasnurkar | 714/733 |
| 2013/0007684 | A1 * | 1/2013 | Kramer et al. | 716/112 |

OTHER PUBLICATIONS

F. Hapke, R. Krenz-Baath, A. Glowatz, J. Schloeffel, H. Hashempour, S. Eichenberger, C. Hora, D. Adolfsson, "Defect-Oriented Cell-Aware ATPG and Fault Simulation for Industrial Cell Libraries and Designs", Proc. of IEEE Int'l Test Conf, ITC, 2009, paper 1.2.

F. Hapke, W. Redemund, J. Schloeffel, R. Krenz-Baath, A. Glowatz, H. Hashempour, S. Eichenberger, "Defect-Oriented Cell-Internal Testing", Proc. of IEEE Int'l Test Conf, ITC, 2010, paper 10.1.

* cited by examiner

Primary Examiner — Naum B Levin (57) ABSTRACT

Cell-aware fault models for delay faults are created for library cells. Analog one-clock-cycle fault simulations are first performed on a transistor-level netlist of a cell to identify type one detectable defects and type two detectable defects in defects of interest. The type one detectable defects are detectable by one-clock-cycle testing and their fault models may be created based on results of the analog one-clock-cycle fault simulations. The type two detectable defects are defects for which two-cycle detection conditions may be calculated from corresponding results of the analog one-cycle fault simulations. Analog two-clock-cycle fault simulations are then performed for the rest defects in the defects of interest to determine type three detectable defects and their detection conditions. The created cell-aware fault models may be used to generate cell-aware test patterns.

26 Claims, 4 Drawing Sheets

CELL-AWARE FAULT MODEL GENERATION FOR DELAY FAULTS

FIELD OF THE INVENTION

The present invention is directed to testing of integrated circuits (ICs). Various aspects of the invention may be particularly useful for modeling defects and generating high quality test patterns for delay Faults.

BACKGROUND OF THE INVENTION

A wide range of conventional fault models have been used by automated test pattern generation (ATPG) tools to generate test patterns for detecting defects in integrated circuits, such as stuck-at, bridging, inter-cell-opens, and transition faults. While the conventional fault models are efficient in addressing defects between library cell instances, at the ports of library cells, and between the interconnect lines outside of library cells, many intra-cell defects are not detectable by test patterns generated based on the conventional fault models.

Several approaches have been developed to target defects undetectable with the conventional fault models. N-detection based approaches improve the defect coverage by targeting the same fault multiple times under different conditions. However, this typically increases the number of patterns by a factor of N and therefore makes the testing costly. Embedded multi detect based approaches increase the defect coverage by utilizing unused bits in existing test patterns. Unlike the methods based on N-detection, no additional test patterns are needed with the EMD-based approaches. Nevertheless, there exists only a probabilistic relation to actual defects for both techniques. Thus, it is difficult to quantify the additional defect coverage provided by these techniques relative to conventional techniques, and to predict the resulting benefit for future designs. Gate-exhaustive testing approaches are also developed to detect intra-cell defects. Like the N-detection based approaches, however, the gate-exhaustive testing approaches tend to generate a very large number of additional patterns and result in high test costs.

Cell-aware fault models have been developed to directly target intra-cell defects. The methods are discussed in U.S. patent application Ser. No. 12/718,799, entitled "Cell-Aware Fault Model Creation And Pattern Generation," filed on Mar. 5, 2010, and naming Friedrich Hapke et al. as inventors, which application is incorporated entirely herein by reference (referred to as "U.S. patent application Ser. No. '799" hereinafter). In the methods using cell-aware fault models, intra-cell defects are extracted based on both layout data and transistor-level netlists for a library cells. Analog simulations are applied to determine detection conditions for the defects. The cell-aware based approaches can be applied to various intra-cell defects that can cause stuck-at and time-related faults. For many time-related faults, two-cycle sequential testing is needed. Due to exhaustive simulations in two time frames, however, generation of timing-related cell-aware fault models can lead to long analog fault simulation runtimes.

BRIEF SUMMARY OF THE INVENTION

Aspects of the invention relate to cell-aware fault model creation and pattern generation for testing delay faults. In various embodiments of the invention, cell-aware fault models for a library cell are created based on a transistor-level netlist of the cell and defects of interest determined based on the layout data and the transistor-level netlist. To create cell-aware fault models for the cell, analog one-clock-cycle (or one-cycle) fault simulations are first performed for the defects of interest to identify type one detectable defects and type two detectable defects. The type one detectable defects are detectable by one-cycle testing and their fault models may be created based on results of the analog one-cycle fault simulations for the type one detectable defects. The type two detectable defects are defects for which two-cycle detection conditions may be calculated from corresponding results of the analog one-cycle fault simulations. Analog two-cycle fault simulations may then be performed for defects in the defects of interest that are neither type-one detectable defects nor type-two detectable defects to determine type three detectable defects and their two-cycle detection conditions. Finally, two-cycle cell-aware fault models for the type two and type three detectable defects may be created based on the corresponding two-cycle detection conditions. One-cycle cell aware fault models for the type one detectable defects may be determined based on results of the analog one-cycle fault simulations for the type one detectable defects. The created one-cycle and two-cycle cell-aware fault models can be used to generate test patterns.

DETAILED DESCRIPTION OF THE INVENTION

Various aspects of the present invention relate to cell-aware fault model generation for sequential tests. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine," "identify," "derive," "generate" and "create" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit. Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Exemplary Operating Environment

Figure 1:
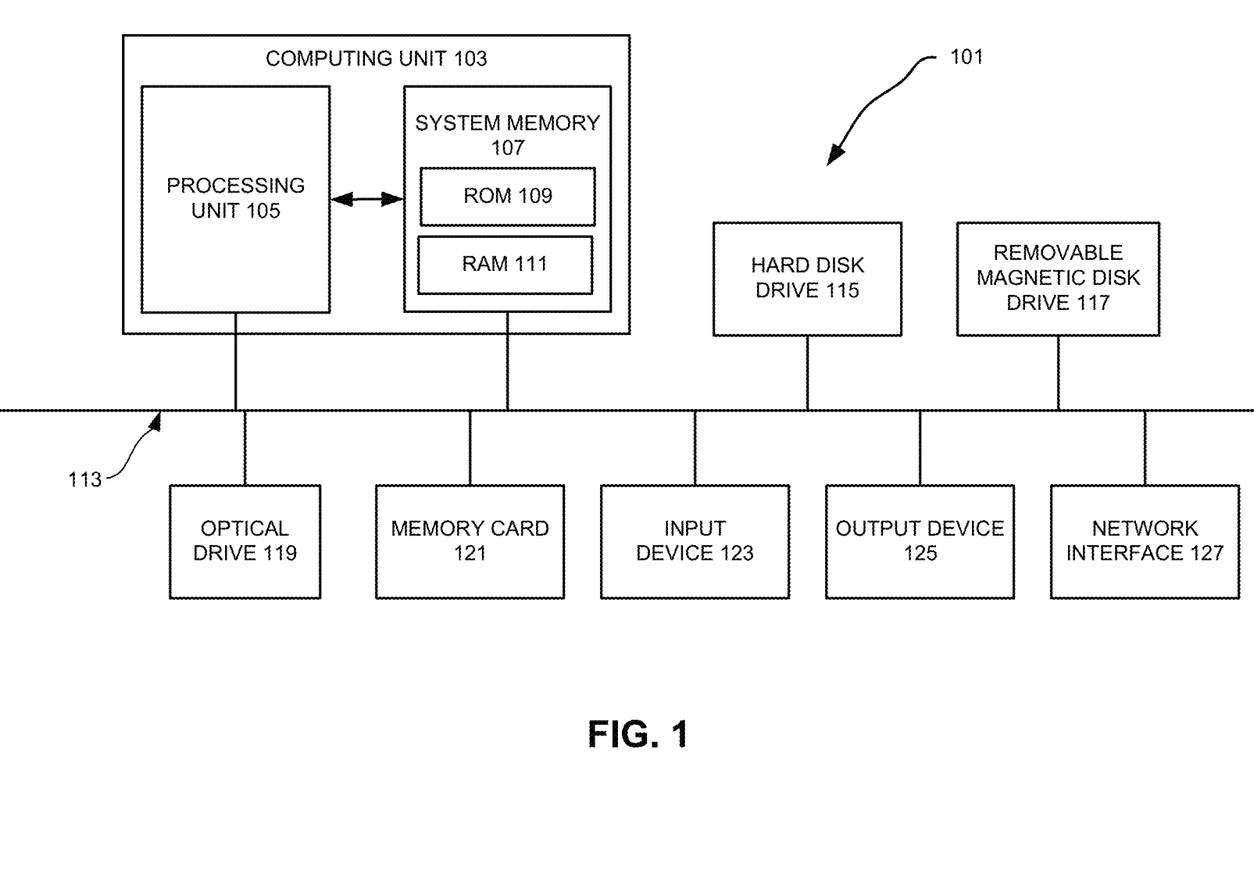
FIG. 1 illustrates a programmable computer system with which various embodiments of the invention may be employed.

Various embodiments of the invention may be implemented through the execution of software instructions by a computing device, such as a programmable computer. Further, various embodiments of the invention may be implemented by a computer executing various software instructions for performing the functionality of the invention, or by software instructions for performing the functionality of the invention stored on a computer-readable medium. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Types of Defects and Analog Two-Cycle Fault Simulations

Figure 2:
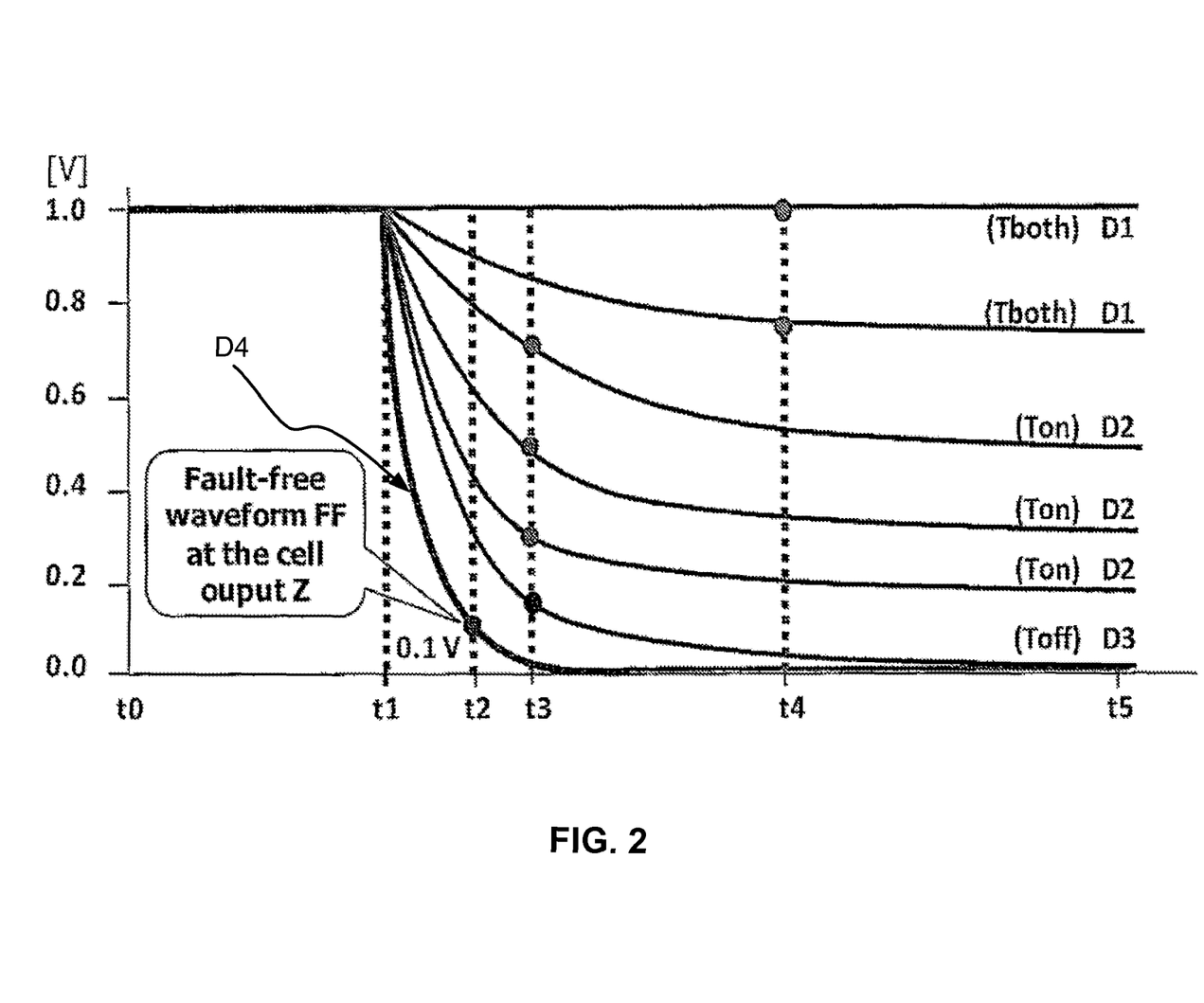
FIG. 2 illustrates an example of two-clock-cycle testing.

Some intra-cell defects may cause timing-related problems and can be detected under two-clock-cycle testing (or two-cycle testing). FIG. 2 illustrates an example of the two-cycle testing. Waveform D4 represents a fault-free waveform. At $t_0$, the onset of the first clock cycle, the two-cycle testing applies a stimulus to the inputs of the circuit under test to establish a value at an output. In the example, the established output value is 1.0 volt. Then at $t_1$, the onset of the second clock cycle, another stimulus is applied to the inputs of the circuit to induce a transition at the output. In the case of the waveform D4, the output value drops to 0.1 volt at $t_2$ and settle to 0 volt at $t_4$. Different types of defects can cause the output value to settle at different values.

Figure 3:
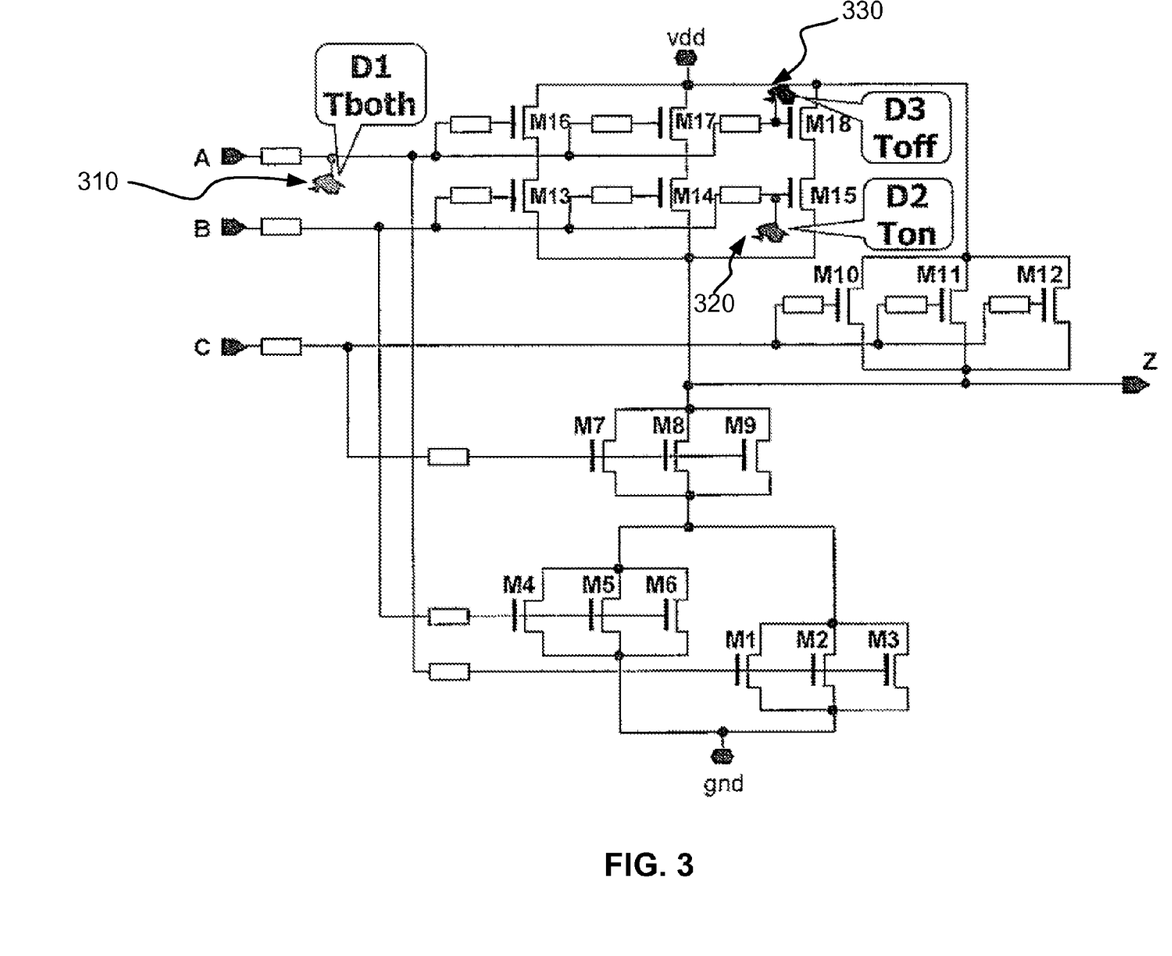
FIG. 3 illustrates an example of a library cell with delay faults.

Waveforms D1 represent a type of defects (D1 defects or type one defects) that can be detected by probing the output voltage at as late as $t_5$, i.e., when the circuit reaches a steady state. The two-cycle testing for D2 is sometimes referred to as gross delay testing. One-clock-cycle testing (or one-cycle testing) can also be applied to detect the D1 defects because the value at the output never drops below a threshold voltage and can be treated as settling at a state opposite to that in the defect-free case. FIG. 3 illustrates an example of a library cell. In FIG. 3, a D1 defect may be a bridge to ground at location 310. This bridge influences both P-type and N-type transistors.

Waveforms D2 represent a type of defects (D2 defects or type two defects) that can be detected by probing the output voltage not at $t_5$ but at an earlier time such as $t_3$ because the steady-state values (at $t_5$) for the output lie, e.g., between 0.2 and 0.8 volts which are below the threshold voltage. The two-clock-cycle testing for D2 is sometimes referred to as small delay testing, in contrast to the gross delay testing for detecting the D1 defects. In FIG. 3, a D2 defect may be a bridge to ground at location 320. This bridge causes one of the parallel transistors (M15) to be switched on when it should be switched off. Thus, some P-type and N-type transistors are switched on at the same time and produce a longer delay than the defect-free circuit but shorter delay than the circuit with a D1 defect.

Waveform D3 represents a type of defects (D3 defects or type three defects) that can also be detected by the small delay testing but at an even earlier time. Unlike the D1 and D2 defects, the D3 defects do not produce a steady state voltage of the output different from that for the defect-free circuit. In FIG. 2, for example, the steady state voltage for the D3 defects drops to 0 volt. In FIG. 3, a D3 defect may be a bridge to Vdd at location 330. This bridge switches off one of the parallel transistors (M18) when it should be switched on. The D3 defects may be considered to be detected when the voltage of the output deviates more than a specified limit from the defect-free case at a certain time after $t_j$. The D3 defects may also be detected by measuring the delayed transition time.

While analog two-cycle simulations can be used to identify the D1, D2 and D3 defects and their detection conditions, this may lead to long runtimes and high computational costs. For robust sequential testing, the total number of analog simulations for a sequential analysis with two cycles (i.e. an initial and a final cycle) is:

$$N_{2(robust)} = 2^m \cdot m \cdot (d+1).$$

For non-robust sequential tests, the total number of analog simulations for a sequential analysis with two cycles (i.e. an initial and a final cycle) is:

$$N_{2(non-robust)} = 2^m \cdot (2^m - 1) \cdot (d+1).$$

On the other hand, the total number of analog simulations for a one-clock-cycle analysis is:

$$N_1 = 2^m \cdot (d+1).$$

In the above three equations, m denote the number of inputs of a library cell, d denotes the number of defects considered, and the operand "+1" correlates to a fault-free simulation. The number of library cell inputs is typically in the range of 1 to 8, while the number of defects could easily reach a few hundreds. Comparing the three equations, it is easy to understand why it is desirable to reduce the number of defects that need to be simulated with the analog two-cycle simulations.

In various embodiments of the invention, analog one-cycle simulations may be used to identify the D1 and D2 defects in defects of interest due to the fact that the steady state values for the output caused by D1 and D2 are different from that in the defect-free case. As already discussed, the D1 defects can be detected under the one-cycle testing. Thus, the detection conditions for the D1 defects can be readily obtained from the analog one-cycle simulations. The D2 defects are not detectable under the one-cycle testing. However, the detection conditions for the D2 defects can still be derived from the one-clock-cycle simulations, which will be discussed in detail below. As a result, the D3 defects are the only ones that need analog two-cycle simulations.

Cell-Aware Fault Model Generation

Figure 4:
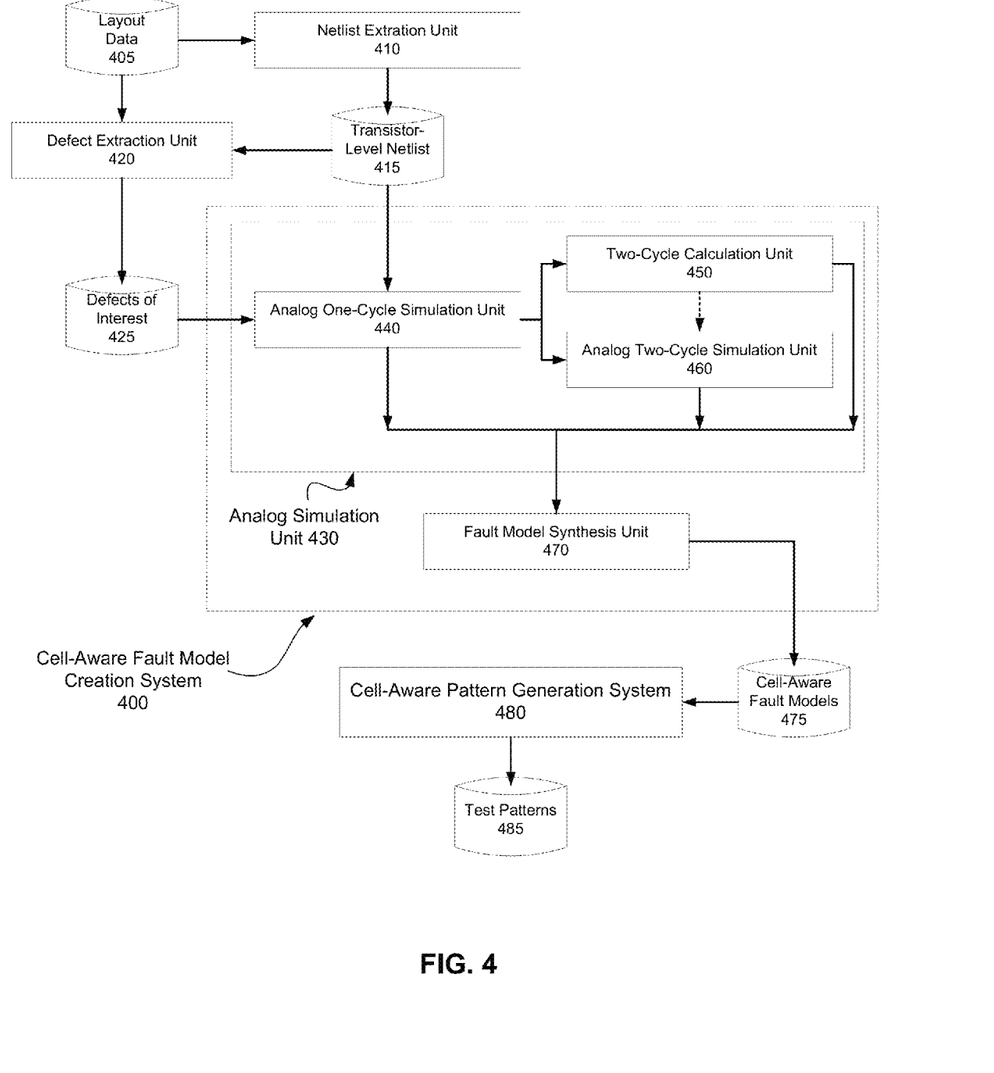
FIG. 4. illustrates an example of a cell-aware fault model creation system according to various embodiments of the invention.

FIG. 4 illustrates an example of a tool for generating cell-aware fault models and test patterns according to various embodiments of the invention. As seen in the figure, the tool has two main systems: a cell-aware fault model creation system 400 and a cell-aware pattern generation system 480. The cell-aware fault model creation system 400 creates fault models for a cell of a library based on the cell's layout data and transistor-level netlist. The created cell-aware fault models may be stored in a cell-aware fault model database 475. The cell-aware pattern generation system 480 may then use the created fault models to generate test patterns, which may be stored in a test pattern database 485.

The cell-aware fault model creation system 400 may include, as shown in FIG. 4, four units: an analog one-cycle simulation unit 440, a two-cycle calculation unit 450, an analog two-cycle simulation unit 460 and a fault model synthesis unit 470. As will be discussed in more detail below, some implementations of the cell-aware fault model creation system 400 may cooperate with (or incorporated) one or more of a layout database 405, a netlist extraction unit 410, a transistor-level netlist database 415, a defect extraction unit 420, and a defects of interest database 425.

According to some embodiments of the invention, one or some of the netlist extraction unit 410, the defect extraction unit 420, the analog one-cycle simulation unit 440, the two-cycle calculation unit 450, the analog two-cycle simulation unit 460, the fault model synthesis unit 470, and the cell-aware pattern generation system 480 may be implemented by one or more computing systems, such as the computing system illustrated in FIG. 1, executing programmable instructions. Correspondingly, some other embodiments of the invention may be implemented by software-executable instructions, stored on a computer-readable medium, for instructing a computing system to perform functions of one or some of the netlist extraction unit 410, the defect extraction unit 420, the analog one-cycle simulation unit 440, the two-cycle calculation unit 450, the analog two-cycle simulation unit 460, the fault model synthesis unit 470, and the cell-aware pattern generation system 480. The computer-readable medium may be, for example, a magnetic storage device, an optical storage device, a "punched" surface type device, or a solid state storage device. While the layout database 405, the transistor-level netlist database 415, the defects of interest database 425, the cell-aware fault model database 475, and the test pattern database 485 are shown as separate units in FIG. 4, a single computer-readable medium may be used to implement some or all of these databases.

For ease of understanding, cell-aware fault model generation methods that may be employed according to various embodiments of the invention will be described with reference to the tool for generating cell-aware fault models and test patterns illustrated in FIG. 4. It should be appreciated, however, that alternate implementations of a tool for generating cell-aware fault models and test patterns may be used to perform the cell-aware fault model generation methods according to various embodiments of the invention. Likewise, the tool for generating cell-aware fault models and test patterns illustrated in FIG. 4 may be employed to perform other cell-aware fault model generation methods according to various embodiments of the invention.

With various implementations of the invention, the analog one-cycle simulation unit 440 is configured to perform analog one-cycle fault simulations based on a transistor-level netlist of a library cell (or cell) to identify type one (D1) detectable defects and type two (D2) detectable defects in defects of interest. The transistor-level netlist may be extracted from layout data for the cell by the netlist extraction unit 410. Various conventional tools can be employed by the netlist extraction unit 410, such as the CALIBRE® Layout-Versus-Schematic (LVS) tool provided with the CALIBRE® family of physical verification software tool available from Mentor Graphics Corporation of Wilsonville, Oreg. The netlist extraction unit 410 may store the extracted transistor-level netlist in the transistor-level netlist database 415 for subsequent operations. The defects of interest may be determined by the defect extraction unit 420 based on the layout data and the transistor-level netlist. Various conventional tools may be used for the extraction process, such as the CALIBRE® xRC™ parasitic extraction tool provided with the CALIBRE® family of physical verification software tool available from Mentor Graphics Corporation of Wilsonville, Oreg. The extracted defects of interest may be stored in the defects of interest database 425. It should be appreciated that the transistor-level netlist, the defects of interest, or both may be (alternatively or additionally) obtained in other ways. For example, users may provide some or all of the defects of interest based on their needs or experience.

In some embodiments of the invention, the defect extraction unit 420 may provide the defects of interest as parasitic features associated with a collection of geometric elements or location data for geometric elements in the layout design. Moreover, because the netlist extraction unit 410 produces the transistor-level netlist from the layout data, the components in the netlist can be correlated with the geometric elements in the layout design. In this manner, the position of the defects of interest relative to the components in the transistor-level netlist can be determined, and the defects can later be inserted (or "injected") into the transistor-level netlist.

The analog one-cycle simulation unit 440 may start the analog one-cycle simulations with netlist modification—defect injection. For example, if a bridge is a defect candidate, then a resistor may be inserted between the corresponding two nets. For an open fault, the corresponding electrical object (e.g. transistor gate, resistor, capacitor or the wire) is disconnected (or a very high resistance is included) during the analog simulations.

After a particular defect has been inserted, an exhaustive set of digital input patterns may be simulated on the modified netlist according to some embodiments of the invention. Additionally, each cell may be simulated without defects in order to determine the golden voltage (i.e., the expected voltage) at the cell outputs for every cell-input combination. The simulations are analog DC-analysis simulations (i.e., analog one-cycle simulations) which can determine the steady state voltage of the cell output(s).

Based on the steady state voltage of the cell output(s), the analog one-cycle simulation unit 440 may determine whether a defect as a type one detectable defect, a type two detectable defect or a defect undetectable under the one-cycle testing. A type one detectable defect may be defined as the one that after being inserted, at least for one input combination (or assignment), one or more of the cell's output ports produce a voltage which is inverted to the golden voltage—e.g., the produced defective voltage deviates by 20% of the supply voltage from the fault free/golden output value. A type two detectable defect may be defined as the one that after being inserted, at least for one input combination (or assignment), one or more of the cell's output ports produce a voltage which deviates, e.g., by 20% to 80% of the supply voltage from the fault free/golden output value. Of course, with still other implementations of the invention, the deviation threshold may also be specified by users. The simulations may be automated by a set of scripts around a state-of-the-art analog simulator.

The results of the analog one-cycle fault simulations for the type one detectable defects may be summarized into a one-cycle detection matrix for each of the library cells. The detection matrix' rows and columns refer to input combinations and defects, respectively.

The two-cycle calculation unit 450 is configured to determine two-cycle detection conditions (calculated two-cycle detection conditions) for the type two detectable defects based on results of the analog one-cycle fault simulations for the type two detectable defects. As mentioned above, the type two detectable defects cannot be detected under the one-cycle testing. The two-cycle detection conditions for the type-two detectable defects, however, can be calculated from the results of the analog one-cycle fault simulations. The two-cycle detection conditions for a defect comprise combinations of input assignments for two clock cycles and corresponding output transition(s) that can be used to detect the defect.

The two-cycle calculation unit 450 may first determine input assignments for the second clock cycle (or final time frame stimuli). In the results of the analog one-cycle fault simulations, those input assignments that cause one or more of the cell's output ports to produce a voltage which deviates, e.g., by 20% to 80% of the supply voltage from the fault free/golden output value may be designated as the input assignments for the second clock cycle. Based on the input assignments for the second clock cycle, the two-cycle calculation unit 450 may derive input assignments for the first clock cycle (or initial time frame stimuli) to form robust sequential testing. This may be done by inverting the value at one input of the final input assignment at a time. The calculated two-cycle detection conditions are derived by determining whether an edge at the output(s) is generated by a combination of one input assignment for the first clock cycle and one input assignment for the second clock cycle. An example of a robust two-cycle stimuli analysis is illustrated in Table 1. The column IT in Table 1 lists the stimuli to be applied during the initial timeframe. The column FT shows the stimuli to be applied during the final timeframe. The column Z contains the fault free waveform at the output of the cell.

TABLE 1

Robust two-cycle stimuli

| IT | FT | Z |
|---|---|---|
| 000 | 001 | (waveform) |
|  | 010 | (waveform) |
|  | 100 | (waveform) |
| 001 | 000 | (waveform) |
|  | 011 | (waveform) |
|  | 101 | (waveform) |
| 010 | 011 | (waveform) |
|  | 000 | (waveform) |
|  | 110 | (waveform) |
| 011 | 010 | (waveform) |
|  | 001 | (waveform) |
|  | 111 | (waveform) |
| 100 | 101 | (waveform) |
|  | 110 | (waveform) |
|  | 000 | (waveform) |
| 101 | 100 | (waveform) |
|  | 111 | (waveform) |
|  | 001 | (waveform) |
| 110 | 111 | (waveform) |
|  | 100 | (waveform) |
|  | 010 | (waveform) |
| 111 | 110 | (waveform) |
|  | 101 | (waveform) |
|  | 011 | (waveform) |

When no robust two-cycle stimuli can produce an edge, non-robust two-cycle stimuli may be determined. To search for the non-robust two-cycle stimuli, more than one cell inputs may be inverted from the first clock cycle to the second clock cycle. The calculated two-cycle detection conditions for the type two detectable defects may be summarized into a two-cycle detection matrix for each of the library cells.

The analog two-cycle simulation unit 460 is configured to perform analog two-cycle fault simulations to determine type three detectable defects and two-cycle detection conditions (simulated two-cycle detection conditions) for the type three detectable defects. The analog two-cycle fault simulations are performed only for those defects in the defects of interest that are neither the type one detectable defects nor the type two detectable defects. Like the two-cycle calculation unit 450, the analog two-cycle simulation unit 460 in some embodiments of the invention may construct robust two-cycle input assignments first to determine whether a defect is a type three detectable defect. When no robust two-cycle assignments can detect a defect, non-robust two-cycle assignments are used for the defect. The simulated two-cycle detection conditions for the type three detectable defects may be incorporated into the two-cycle detection matrix constructed by the two-cycle calculation unit 450 or summarized in a new two-cycle detection matrix for the type three detectable defects.

The fault model synthesis unit 470 is configured to generate cell-aware fault models for two-cycle testing of the type two detectable defects and the type three detectable defects based on the calculated two-cycle detection conditions and the simulated two-cycle detection conditions. The fault model synthesis unit 470 may also generate cell-aware fault models for one-cycle testing of the type one detectable defects based on results of the analog one-cycle fault simulations for the type one detectable defects. The cell-aware fault models are sometimes also referred to as cell-aware library views. According to various embodiments of the invention, this synthesis operation extracts a set of necessary input assignments for each detectable defect to relax the future pattern generation process.

With some implementations of the invention, the following method may be used for generating cell-aware fault models for one-cycle testing of the type one detectable defects. Assuming a detection matrix D is generated for an n-input library cell C implementing the combinational Boolean function F, for every detectable defect d specified in D, a detection function $g_d$ is generated based on the detection matrix D. This detection function $g_d$ incorporates all fully defined input-assignments which would be required to detect d, i.e. input assignments without don't-cares (or necessary input assignments). As will be appreciated by those of ordinary skill in the art, don't-cares may refer to input ports of a cell or bits in test patterns of which values are irrelevant to detecting defects of interest. Next, every detection-function is combined with function F and its inverse F' in order to find the corresponding output assignment for every cube contained in $g_d$. After that, all prime cubes of the resulting functions $g_{dF}$ and $g_{dF'}$ are collected in the set $R_d$. Finally the method compresses identical cubes with respect to all sets $R_d$ and the corresponding defect information in two sets P and M, where P denotes the final set of primes cubes (the union of all prime cubes contained in all sets $R_d$, d member of D), and M denotes a set of sets containing every detectable defect d detected by the corresponding prime cube. The mapping between an element of P and a set in M is defined via their indices. This means that the cube $P_i$ detects all detectable defects contained in the set $M_i$.

The cell-aware pattern generation system 480 is configured to generate test patterns based on the created cell-aware fault models. Various methods such as those similar to what are described in the U.S. patent application Ser. No. '799 may be employed by the cell-aware pattern generation system 480.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. A method of cell-aware fault model generation, executed by at least one processor of a computer, comprising:
   receiving a transistor-level netlist and defects of interest for a cell;
   performing, at least one processor of a computer, analog one-cycle fault simulations based on the transistor-level netlist to identify type one detectable defects and type two detectable defects in the defects of interest;
   determining calculated two-cycle detection conditions for the type two detectable defects based on results of the analog one-cycle fault simulations for the type two detectable defects;
   performing analog two-cycle fault simulations based on the transistor-level netlist and the defects of interest, the type one detectable defects and the type two detectable defects to determine type three detectable defects and simulated two-cycle detection conditions for the type three detectable defects;

generating two-cycle cell-aware fault models for two-cycle testing of the type two detectable defects and the type three detectable defects based on the calculated two-cycle detection conditions and the simulated two-cycle detection conditions; and storing the two-cycle cell-aware fault models for two-cycle testing of the type two detectable defects and the type three detectable defects.

2. The method recited in claim 1, wherein the transistor-level netlist is extracted from layout data of the cell.

3. The method recited in claim 1, further comprising:
generating one-cycle cell-aware fault models for one-cycle testing of the type one detectable defects based on results of the analog one-cycle fault simulations for the type one detectable defects; and
storing the one-cycle cell-aware fault models for one-cycle testing.

4. The method recited in claim 1, further comprising:
generating test patterns based on the two-cycle cell-aware fault models.

5. The method recited in claim 1, wherein the defects of interest is determined based on layout data of the cell and the transistor-level netlist.

6. The method recited in claim 1, wherein the type one detectable defects are defects that can be detected by one-cycle testing and the type two detectable defects are defects for which two-cycle detection conditions may be calculated without performing analog two-cycle fault simulations.

7. The method recited in claim 1, wherein the type one detectable defects are defects that can cause one or more outputs of the cell to output a voltage that deviates from a golden voltage by a percentage of the golden voltage less than a first predetermined number, and the type two detectable defects are defects that can cause one or more outputs of the cell to output a voltage that deviates from the golden voltage by a percentage of the golden voltage between the first predetermined value and a second predetermined value.

8. The method recited in claim 1, wherein the performing analog one-cycle fault simulation comprises:
selecting a defect from the defects of interest;
inserting the defect into the transistor-level netlist to generate a modified transistor-level netlist; and
performing analog one-cycle fault simulations on the modified transistor-level netlist to determine whether the defect is a type one detectable defect, a type two detectable defect or else.

9. The method recited in claim 8, wherein the performing analog one-cycle fault simulation further comprises:
generating a detection matrix based on results of the analog one-cycle fault simulations for the type one detectable defects.

10. The method recited in claim 1, wherein the determining calculated two-cycle detection conditions comprises:
determining final time frame stimuli based on results of the analog one-cycle fault simulations for the type two detectable defects;
determining initial time frame stimuli based on the final time frame stimuli; and
determining calculated two-cycle detection conditions based on the final time frame stimuli, the initial time frame stimuli and the results of the analog one-cycle fault simulations for the type two detectable defects.

11. The method recited in claim 1, wherein the performing analog two-cycle fault simulations comprises:
determining type three defect candidates based on the defects of interest, the type one detectable defects and the type two detectable defects;
selecting a defect from the type three defect candidates;
injecting the defect into the transistor-level netlist to generate a modified transistor-level netlist; and
performing analog two-cycle fault simulations on the modified transistor-level netlist to determine whether the defect is a type three detectable defect, and to derive simulated two-cycle detection conditions if the defect is a type three detectable defect.

12. The method recited in claim 1, wherein the performing analog two-cycle fault simulations comprises employing a robust two-cycle test generation technique.

13. The method recited in claim 1, wherein the generating two-cycle cell-aware fault models comprises:
generating prime cubes by determining necessary input combinations based on the calculated two-cycle detection conditions and the simulated two-cycle detection conditions, the necessary input combinations being input combinations required to detect the defects without don't cares; and
combining the prime cubes with corresponding output combinations.

14. The method recited in claim 13, wherein generating two-cycle cell-aware fault models further comprises:
compressing identical prime cubes to generate a set of compressed prime cubes and a set of defect lists, each defect list denoting defects that can be detected by a compressed prime cube.

15. A non-transitory processor-readable medium storing processor-executable instructions for causing one or more processors to perform a method of cell-aware fault model generation, the method comprising:
receiving a transistor-level netlist and defects of interest for a cell;
performing analog one-cycle fault simulations based on the transistor-level netlist to identify type one detectable defects and type two detectable defects in the defects of interest;
determining calculated two-cycle detection conditions for the type two detectable defects based on results of the analog one-cycle fault simulations for the type two detectable defects;
performing analog two-cycle fault simulations based on the transistor-level netlist and the defects of interest, the type one detectable defects and the type two detectable defects to determine type three detectable defects and simulated two-cycle detection conditions for the type three detectable defects;
generating two-cycle cell-aware fault models for two-cycle testing of the type two detectable defects and the type three detectable defects based on the calculated two-cycle detection conditions and the simulated two-cycle detection conditions; and
storing the two-cycle cell-aware fault models for two-cycle testing of the type two detectable defects and the type three detectable defects.

16. The non-transitory processor-readable medium recited in claim 15, wherein the transistor-level netlist is extracted from layout data of the cell.

17. The non-transitory processor-readable medium recited in claim 15, wherein the method further comprises:
generating one-cycle cell-aware fault models for one-cycle testing of the type one detectable defects based on results of the analog one-cycle fault simulations for the type one detectable defects; and storing the one-cycle cell-aware fault models for one-cycle testing.

18. The non-transitory processor-readable medium recited in claim 15, wherein the defects of interest is determined based on layout data of the cell and the transistor-level netlist.

19. The non-transitory processor-readable medium recited in claim 15, wherein the type one detectable defects are defects that can be detected by one-cycle testing and the type two detectable defects are defects for which two-cycle detection conditions may be calculated without performing analog two-cycle fault simulations.

20. The non-transitory processor-readable medium recited in claim 15, wherein the determining calculated two-cycle detection conditions comprises:

determining final time frame stimuli based on results of the analog one-cycle fault simulations for the type two detectable defects;

determining initial time frame stimuli based on the final time frame stimuli; and determining calculated two-cycle detection conditions based on the final time frame stimuli, the initial time frame stimuli and the results of the analog one-cycle fault simulations for the type two detectable defects.

21. The non-transitory processor-readable medium recited in claim 15, wherein the performing analog two-cycle fault simulations comprises:

determining type three defect candidates based on the defects of interest, the type one detectable defects and the type two detectable defects;

selecting a defect from the type three defect candidates;

injecting the defect into the transistor-level netlist to generate a modified transistor-level netlist; and performing analog two-cycle fault simulations on the modified transistor-level netlist to determine whether the defect is a type three detectable defect, and to derive simulated two-cycle detection conditions if the defect is a type three detectable defect.

22. A system of cell-aware fault model generation comprising:

an analog one-cycle simulation unit configured to perform analog one-cycle fault simulations based on a transistor-level netlist for a cell to identify type one detectable defects and type two detectable defects in defects of interest for the cell;

a two-cycle calculation unit configured to determine calculated two-cycle detection conditions for the type two detectable defects based on results of the analog one-cycle fault simulations for the type two detectable defects;

an analog two-cycle simulation unit configured to perform analog two-cycle fault simulations based on the transistor-level netlist and the defects of interest, the type one detectable defects and the type two detectable defects to determine type three detectable defects and simulated two-cycle detection conditions for the type three detectable defects; and a fault model synthesis unit configured to generate two-cycle cell-aware fault models for two-cycle testing of the type two detectable defects and the type three detectable defects based on the calculated two-cycle detection conditions and the simulated two-cycle detection conditions.

23. The system recited in claim 22, wherein the transistor-level netlist is extracted from layout data of the cell.

24. The system recited in claim 22, wherein the defects of interest is determined based on layout data of the cell and the transistor-level netlist.

25. The system recited in claim 22, wherein the type one detectable defects are defects that can be detected by one-cycle testing and the type two detectable defects are defects for which two-cycle detection conditions may be calculated without performing analog two-cycle fault simulations.

26. The system recited in claim 22, wherein the fault model synthesis unit is also configured to generate one-cycle cell-aware fault models for one-cycle testing of the type one detectable defects based on results of the analog one-cycle fault simulations for the type one detectable defects.

* * * * *